United States Patent
Gasperi

(10) Patent No.: US 7,616,010 B2
(45) Date of Patent: Nov. 10, 2009

(54) LINE IMPEDANCE MEASUREMENT METHOD AND SYSTEM

(75) Inventor: Michael L. Gasperi, Racine, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 267 days.

(21) Appl. No.: 11/796,823

(22) Filed: Apr. 30, 2007

(65) Prior Publication Data

US 2008/0265910 A1    Oct. 30, 2008

(51) Int. Cl.
G01R 27/28    (2006.01)
G01R 27/08    (2006.01)

(52) U.S. Cl. ...................... 324/652; 324/691
(58) Field of Classification Search ........... 324/652, 324/691
See application file for complete search history.

(56) References Cited

U.S. PATENT DOCUMENTS

| | | | | |
|---|---|---|---|---|
| 3,904,859 A | * | 9/1975 | Poncelet | 324/649 |
| 5,587,662 A | * | 12/1996 | Kelley et al. | 324/713 |
| 5,631,569 A | * | 5/1997 | Moore et al. | 324/713 |
| 6,397,156 B1 | * | 5/2002 | Bachmann et al. | 702/65 |
| 6,515,485 B1 | * | 2/2003 | Bullock et al. | 324/601 |
| 6,713,998 B2 | * | 3/2004 | Stanimirov et al. | 324/117 R |
| 7,164,275 B2 | * | 1/2007 | Gasperi | 324/652 |
| 7,200,502 B2 | * | 4/2007 | Gasperi et al. | 324/691 |
| 2006/0229831 A1 | * | 10/2006 | Gasperi et al. | 702/60 |
| 2006/0241881 A1 | * | 10/2006 | Gasperi et al. | 702/62 |

* cited by examiner

Primary Examiner—Timothy J Dole
(74) Attorney, Agent, or Firm—Fletcher Yoder Law; Alexander R. Kuszewski

(57) ABSTRACT

A technique is disclosed for determining capacitive, inductive, and resistive components of power line impedance. A measurement circuit switches a burden resistor between power line conductors to cause a droop in a voltage waveform. The voltage waveform is sampled prior to inclusion of the resistor in the circuit, as well as after to identify the droop. The short circuit between the power lines is then removed by opening the circuit and a first effective capacitance in the test circuitry causes a resonant ring due to the inductive component of the power line impedance. The process is repeated a second time with a second effective load capacitance enabled in the test circuitry to cause a second resonant ring. Based upon the frequency of the rings and the voltage measurements, the capacitive, inductive, and resistive components of power line impedance can be computed.

25 Claims, 7 Drawing Sheets

LINE IMPEDANCE MEASUREMENT METHOD AND SYSTEM

BACKGROUND

The present invention relates generally to the field of monitors and measurement devices for electrical power. More particularly, embodiments of the present invention relate to techniques for determining impedance parameters of electrical power, particularly power distributed via a power distribution grid.

A wide range of applications exists for power monitors and devices capable of determining parameters of electrical power. For example, in many applications unwanted conditions can arise in loads, distribution equipment and lines, the severity of which is a function of the line impedance. For example, the line impedance is a precursor to calculating short circuit current, arc current, available energy, and other important features of electrical power. Because these currents and energies can flow or be released during a fault condition or other unwanted, or even desired situations, knowing the power line impedance is of considerable importance.

Various methods exist in the art for calculating or attempting to determine power line impedance. For example, impedance can be computed based upon nameplate information on certain equipment, in addition to knowledge of the physical and electrical characteristics of distribution components. Transformers, for example, typically carry nameplate information regarding impedance as a percentage value. Knowledge of the size and length of electrical conductors, and the characteristics of other intermediate components between the transformer and a load can be used to calculate or estimate the impedance at particular points in a system. However, such techniques are highly imprecise, and rely upon some degree of estimation as to the actual characteristics of the components and transmission lines.

Techniques have also been developed for directly measuring impedance of power lines. Such techniques have permitted some degree of knowledge of the power line impedance, but are still somewhat imprecise or incomplete. For example, known techniques do not typically permit measurement of the capacitive, inductive, and resistive components of the power line impedance. While one of these components may generally dominate the impedance measurement, all of these components are important for determining the actual characteristics of the current and energy that can be released by the power line, particularly during transient periods such as faults. This is especially relevant when the line impedance includes power factor correction capacitors or other parasitic capacitances that may significantly affect the line impedance reading if not properly determined or compensated for.

Therefore, there is a need in the art for improved techniques for measuring and determining impedance of power sources. There is a particular need for a technique that would permit accurate measurement of power line impedance, including capacitance, inductive, and resistive components thereof, or at least compensation for certain of these.

BRIEF DESCRIPTION

The present invention provides novel techniques for determining power line impedance values designed to respond to such needs. The technique can be used in a wide range of settings, such as in available energy determinations, identification of short circuit currents and arc currents, for identifying possible problems with under-loading of power lines, and so forth. The techniques can be used on single-phase and three-phase applications with little modification. Moreover, the technique can be implemented in permanent (i.e., hardwired) circuitry, or can be part of mobile or even hand-held devices used to identify impedance only on a periodic or sporadic basis, such as during system commissioning. Still further, the technique may be implemented through the use of analog circuitry or digital circuitry, such as by sampling the desired input data and subsequent processing to identify the desired impedance parameters.

In accordance with certain aspects of the present techniques, a burden or drain in placed on a power line, the impedance of which is to be measured. The drain causes a droop in the voltage waveform through the power line that can be measured. Following this droop, the drain or burden is removed from the circuit and a first effective capacitor causes, in conjunction with the inductive component of the power line impedance, a first resonant ring. The period or the frequency of the first ring is identified. The burden or drain is then reapplied to the power line causing a second droop in the voltage waveform. Following this second droop, the drain or burden is removed from the circuit and a second effective capacitance causes, in conjunction with the inductive component of the power line impedance, a second resonant ring. The period or the frequency of the second ring can be identified, and used to in conjunction with the period of the first ring to determine the inductive and the capacitive components of the power line impedance. Further, the resistive component can be identified from the voltage droop, and other parameters of the circuitry. The resulting determinations can then be used for subsequent processing or estimations, such as available energy, short circuit current, arc current, and so forth.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
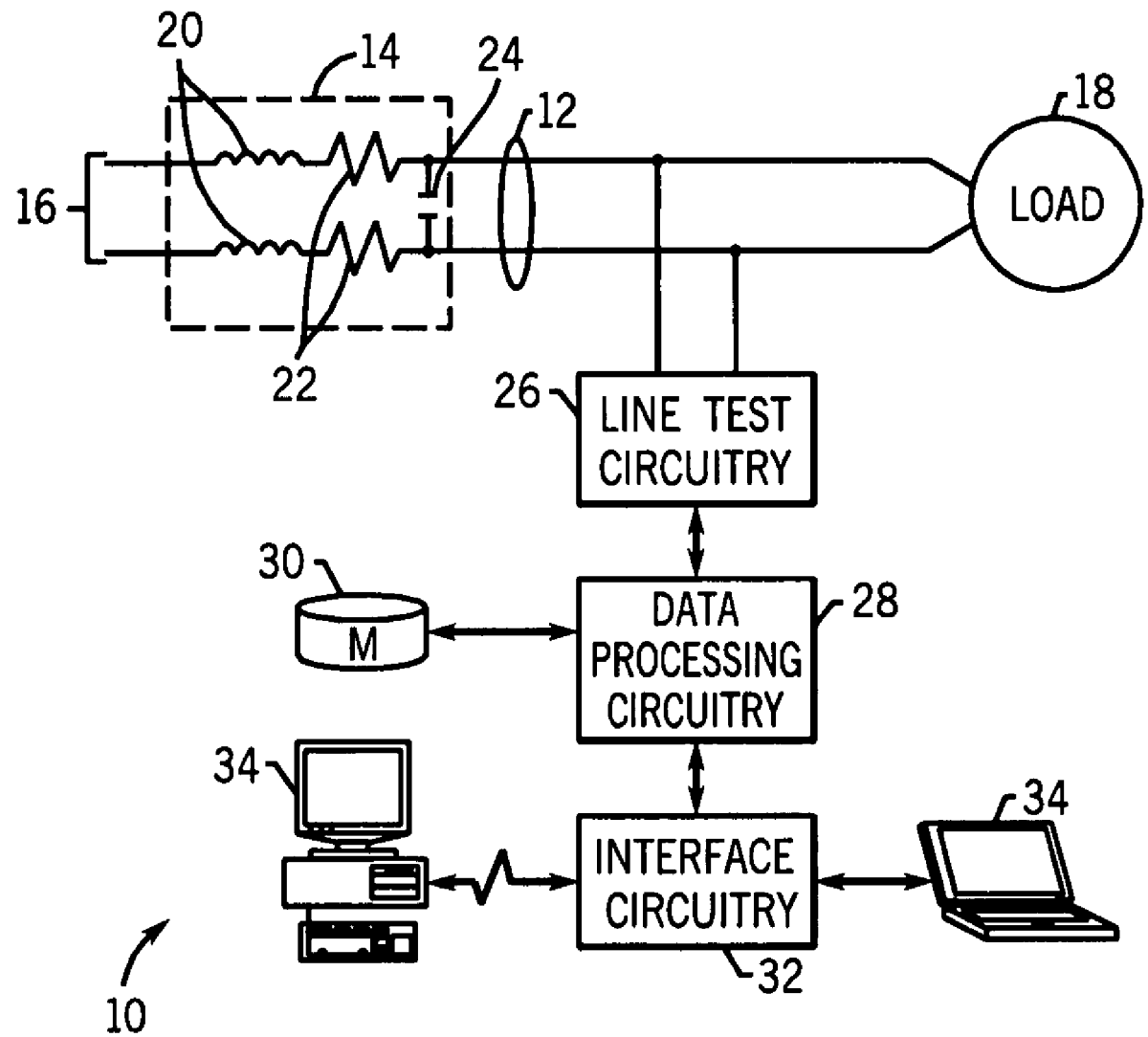
FIG. 1 is a diagrammatical representation of a power line impedance measurement system in accordance with aspects of the present technique, applied to a single-phase application.

Turning now to the drawings, and referring first to FIG. 1, an impedance monitoring system is illustrated and designated generally by the reference numeral 10. The impedance monitoring system is illustrated in a single-phase application. That is, the system is illustrated for identifying the impedance of a single-phase power source. However, as discussed in greater detail below, the system may be easily adapted for identifying impedance parameters of three-phase power lines and sources as well.

Impedance monitoring system 10 is illustrated as coupled to a pair of power supply lines 12. Power supply lines 12, and any upstream circuitry, such as transformers, connectors, and so forth are considered to have a net impedance illustrated by equivalent circuitry in box 14 of FIG. 1. The impedance 14 is, for the present purposes, considered to be a collective or cumulative impedance of the entire power supply network, represented generally by reference numeral 16 to a point between a power supply grid and a load 18. As discussed in greater detail below, the present system provides the potential for determining impedance by measurement at or adjacent to a load 18. In practical applications, the monitoring system 10 may be coupled at any point along the power supply lines.

Impedance 14 is generally considered to include inductive components 20, resistive components 22, and capacitive components 24. The inductive and resistive components will be present in both supply lines, although for the present purposes these components may be grouped or accumulated into a net inductive component and a net resistive component as discussed in greater detail below. Additionally, impedance may include parasitic capacitance component 24. Parasitic capacitance is generally defined as capacitance that is not taken into account when considering ideal circuit elements and may take the form of power factor correction capacitors, as well as any other capacitances that are otherwise unaccounted for. This capacitance may have detrimental effects if not determined or accounted for because it can result in underestimating the true line impedance, and thus, the true available energy.

System 10 includes line test circuitry 26 for perturbing the voltage waveform transmitted through the power lines and for making measurements of the voltage waveform. The line test circuitry 26 is coupled to and works in conjunction with data processing circuitry 28. As discussed in greater detail below, the line test circuitry 26 and the data processing circuitry 28 may, in certain applications, be analog circuitry, or at least partially comprise analog circuitry. In a present embodiment, however, the line test circuitry and the data processing circuitry digitally sample voltage measurements and store the sampled data in a memory 30. The stored sampled voltage measurements are then analyzed to determine parameters of the voltage waveform that are used to compute the values of the inductive, resistive, and capacitive components of the line impedance, or to compensate for certain parasitic capacitance in determining or estimating the power line impedance. Additionally, the data processing circuitry 28 and memory 30 may be any suitable form. For example, both of these components may be included in a general purpose or application-specific computer. Moreover, the circuitry may be local and permanently installed with an application, or may be portable circuitry, such as in hand-held devices. Similarly, the data processing circuitry and memory may be entirely remote from the line test circuitry so as to provide the desired analysis without necessarily displacing equipment or operators to the test site.

The data processing circuitry 28 may be accessed and interfaced with operator workstations by interface circuitry 32. The interface circuitry 32 may include any suitable interfaces, such as Ethernet cards and interfaces, Internet access hardware and software, or other network interfaces. In appropriate situations, the interface circuitry 32 may allow for interfacing with the data processing circuitry by conventional serial port communication, and so forth. As illustrated in FIG. 1, various operator interfaces may be envisioned, including laptop computers, computer workstations, and so forth, as represented generally by reference numeral 34 in FIG. 1.

Figure 2A:
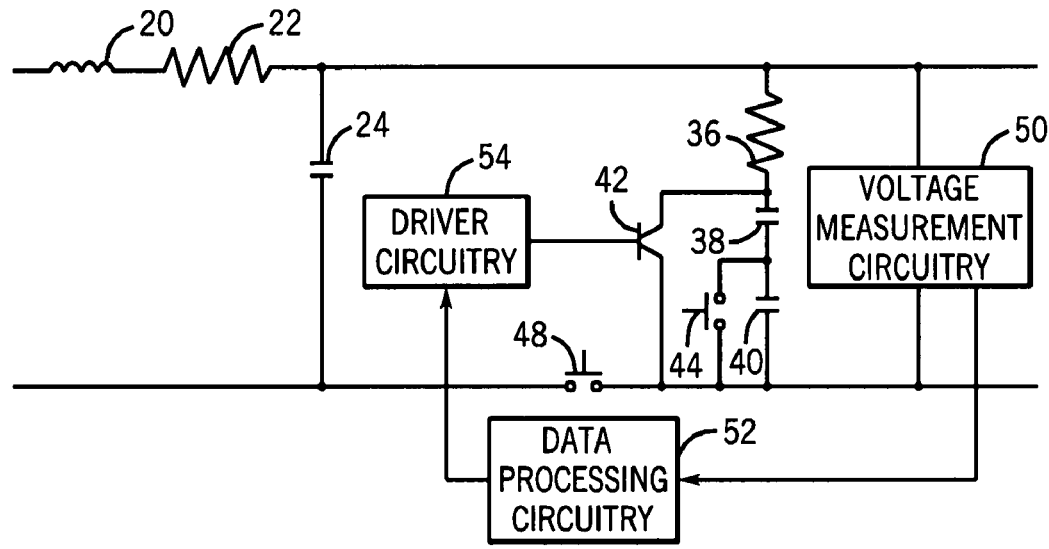
FIG. 2A is a somewhat more detailed view of certain of the circuitry of the power line impedance measurement system of FIG. 1, illustrating a configuration wherein first and second capacitors may be connected in series to cause respective first and second resonant rings in the voltage line.

The line test circuitry 26 is illustrated in somewhat greater detail in FIG. 2A, along with the physical relationship between the portions of the circuitry. As noted above, the collective or cumulative impedance in the power lines may be diagrammatically represented as single inductive component 20, resistive component 22, and parasitic capacitance component 24. The line test circuitry includes a resistor 36 which may be connected in series with a first capacitor 38 and/or a second capacitor 40. The resistor is connected to the capacitor (s) via a solid state switch 42. Additionally, a second switch 44 further enables the first capacitor to be connected in series with second capacitor 40. In other words, second switch 44 enables for a first effective capacitance or a second effective capacitance to be placed in series with resistor 36 via opening or closing of switch 44. For example, when switch 44 is open, the effective capacitance is a function of both the first and second capacitors and may be determined via a standard equation for capacitors in series. Likewise, when switch 44 is closed, the effective capacitance is only a function of the first capacitor because the second capacitor is short circuited via the closing of switch 44. Similarly, solid state switch 42 enables first capacitor 38 and second capacitor 44 to be completely bypassed, creating a short circuit between the power lines during test sequences as summarized below.

Where desired, an enable switch, represented generally at reference numeral 48, may also be provided in series with these components. Switch 48 enables an operator to perform a test sequence, and to remove the components from the power line circuit during normal operation. Thus, switch 48 may permit any leakage current between the power lines to be avoided.

Voltage measurement circuitry 50 is provided that spans the power line conductors. The voltage measurement circuitry 50 may include any suitable voltage measurement configurations, and is particularly adapted to sample voltage across the power lines and to provide values representative of the sampled voltage to data processing circuitry 52. The data processing circuitry 52 includes the data processing circuitry 28 and the memory 30 illustrated in FIG. 1, along with any appropriate programming for carrying out the functions, measurements, and analyses described below. To initiate and advance the test sequences for measuring the parameters of the power line impedance, the data processing circuitry 52 is coupled to driver circuitry 54 which may provide signals to solid switch state 42, switch 44, and/or switch 48 to open and close the switches as described in greater detail below. Additionally, some or all of these switches may be operated manually.

Although the present invention is not intended to be limited to any particular circuit configuration or component values, the following component values have been found effective in identifying impedance parameters in a 60 Hz power source. Resistor 36 was implemented as a 1Ω resistor, while the value of capacitors 38,40 were 20 µF. The switch 42 was selected as an insulated gate bipolar transistor (IGBT) having a voltage rating of 1200V and amperage rating of 400 A. It is advisable that the switch 42 be overrated to some degree to permit peaks in the voltage waveform that may result from opening and closing of the switch, and particularly the affects of the resonant ring following closure.

Figure 2B:
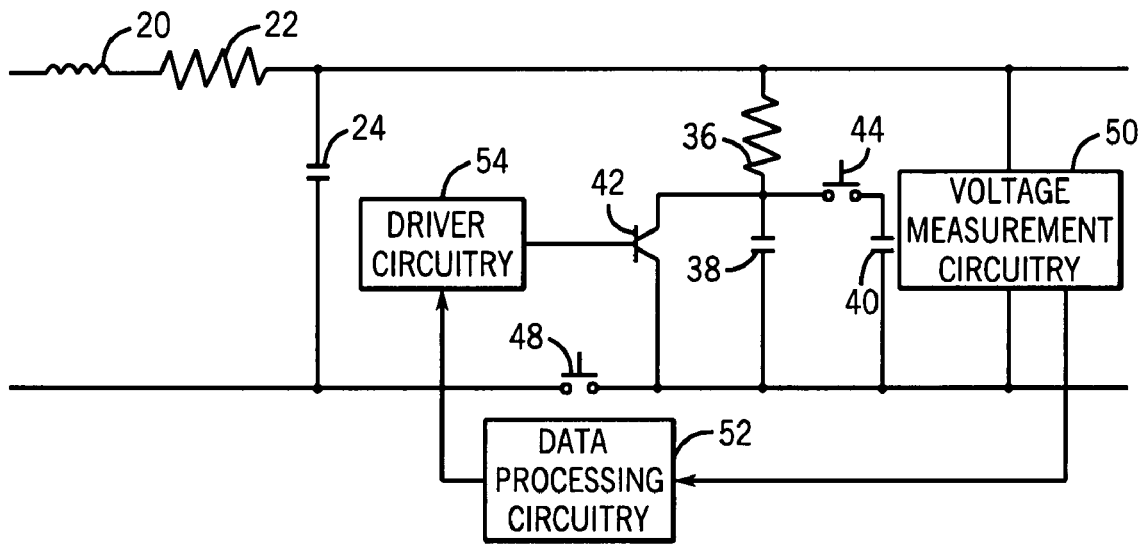
FIG. 2B is a somewhat more detailed view of certain of the circuitry of the power line impedance measurement system of FIG. 1, illustrating a configuration wherein first and second capacitors may be connected in parallel to cause respective first and second resonant rings in the voltage line.
Figure 2C:
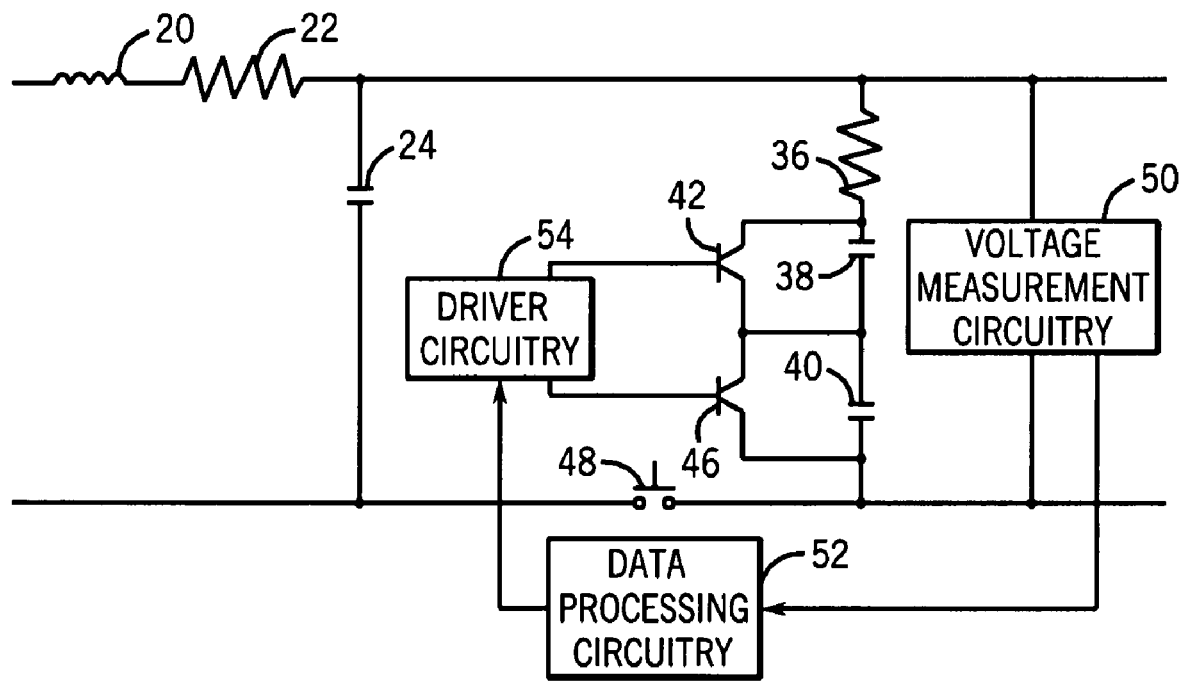
FIG. 2C is a somewhat more detailed view of certain of the circuitry of the power line impedance measurement system of FIG. 1, illustrating an alternate configuration for placing the first and second capacitors in series to cause the first and second resonant rings in the voltage line.

FIGS. 2B and 2C illustrate alternate embodiments of line test circuitry 26 illustrated in FIG. 2A, along with the physical relationship between the portions of the circuitry. As noted in the discussion relating to FIG. 2A, the collective or cumulative impedance in the power lines may be diagrammatically represented as single inductive component 20, resistive component 22, and parasitic capacitance component 24. Similarly, the line test circuitry includes resistor 36 which may be connected in series with a first capacitor 38 and/or a second capacitor 40 via opening solid state switch 42. However, in this configuration second switch 44 enables first capacitor 38 to be connected in parallel with second capacitor 40. Thus, the first and second effective capacitances may be different from those resulting from operation of the circuitry illustrated in FIG. 2A, and may be determined via a standard equation for capacitors in parallel. In short, this embodiment provides another option for creating different effective capacitances that may be connected to the resistor and placed between the line and different electrical potentials. Further, the embodiments illustrated in FIGS. 2A and 2B may even be combined to provide additional options for enabling more than two effective capacitances. In fact, either of these embodiments may include additional capacitors and additional switches for enabling multiple effective capacitances.

FIG. 2C illustrates a third configuration that provides a second solid state switch 46 that enables first capacitor 38 to be connected in series with second capacitor 40. Again, solid state switch 46 enables first and second effective capacitances to be placed in series with resistor 36 via opening or closing of the switch. As before, the embodiments illustrated in FIGS. 2B and 2C enable solid state switch 42, second switch 44, or solid state switch 46 to bypass first capacitor 38 and second capacitor 40 by creating a short circuit between the power lines during a test sequences as summarized below.

Figure 3:
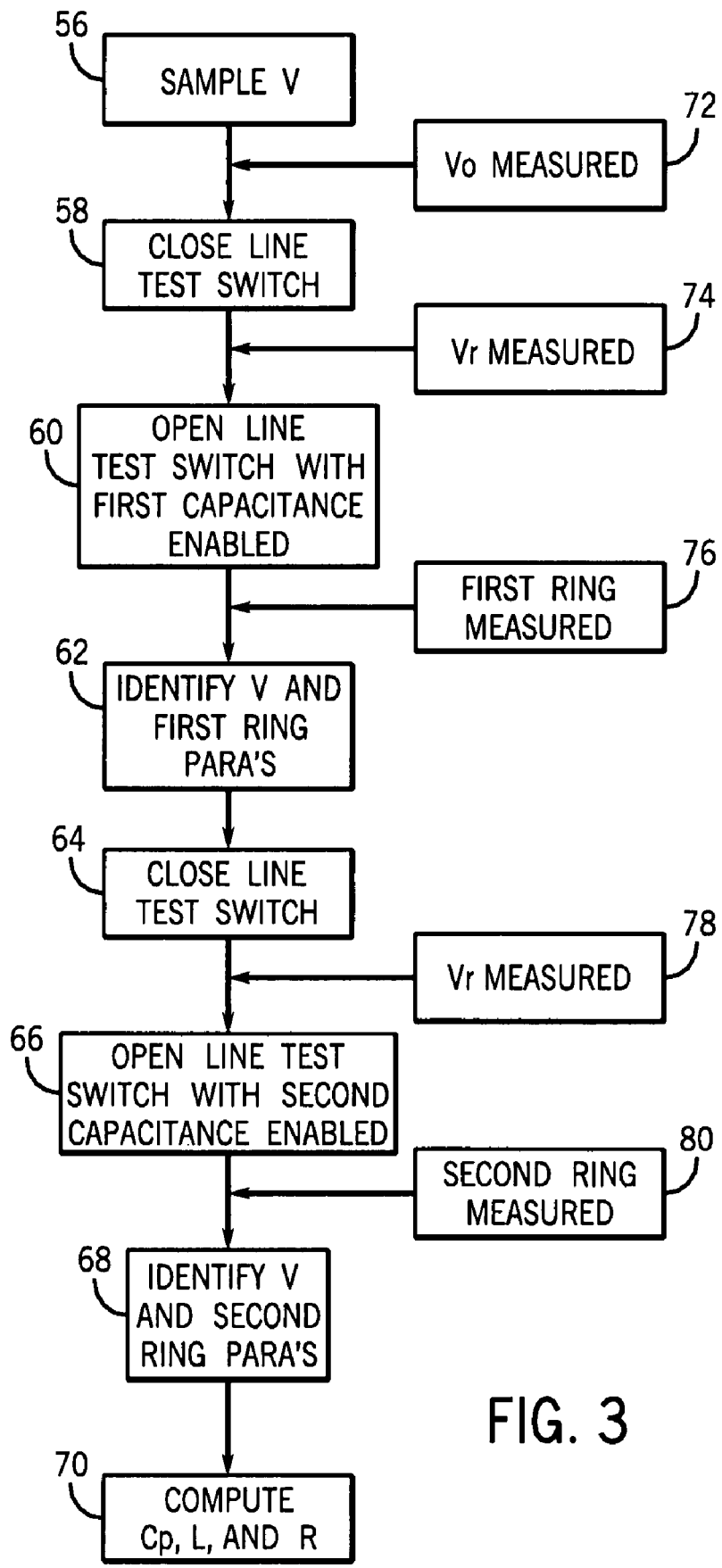
FIG. 3 is a diagrammatical representation of certain exemplary steps in identifying power line impedance values based upon the circuitry of FIGS. 1-2C.

Exemplary logic for a particular test sequence implemented by the circuitry of FIGS. 2A-2C is illustrated diagrammatically in FIG. 3. As noted above, voltage measurement circuitry 50 first begins to sample voltage across the power lines as indicated at reference numeral 56. At a desired point in the waveform, switch 42 is closed, as indicated at step 58 in FIG. 3. Closure of switch 42 (with switch 48 closed to enable the circuitry, where such a switch is provided) causes a short circuit between the power lines, by routing current around capacitor 38. The low value of the resistor 36 acts as a drain or burden, causing a droop in the voltage waveform peak as described in greater detail below. Subsequently, switch 42 is opened, as indicated at reference numeral 60, with switch 44 closed in FIG. 2A and open in FIG. 2B.

Opening of switch 42 then causes a first resonant ring between the inductive component 20 of the line impedance and capacitor 38. This resonant ring is dampened by the resistive component 22 of the power line impedance and by the resistor 36. The relevant ring parameters are then identified, as indicated at reference numeral 62.

The process is then generally repeated to identify parameters of a second resonant ring when a second effective capacitance is placed between the line and the electrical potential. Specifically, at a desired point in the waveform, switch 42 is closed for a second time, as indicated at step 64. Closure of switch 42 causes a short circuit between the power lines, by routing current around first capacitor 38 and second capacitor 40. As before, the low value of the resistor 36 acts as a drain or burden, causing a droop in the voltage waveform peak as described in greater detail below. Subsequently, switch 42 is opened, as indicated at reference numeral 60, with switch 44 open in FIG. 2A and closed in FIG. 2B. Opening of switch 42 causes a second resonant ring between the inductive component 20 of the line impedance and capacitor 38 and 40. This resonant ring is dampened by the resistive component 22 of the power line impedance and by the resistor 36. The relevant ring parameters are then identified for this second resonant ring, as indicated at reference numeral 68.

With the voltage continuously being measured (i.e., sampled) by the voltage measurement circuitry 50, measurements are stored in the memory circuitry for later analysis. In a present implementation, with digital sampling of the voltage waveform, at steps 72, 74, 76, 78, and 80 in FIG. 3, the voltage and ring parameters used to identify the inductive and resistive components of the line impedance may be determined as indicated at step 62 and 68. At step 70 the capacitive, inductive, and resistive components of the line impedance are then computed based upon these identified values.

Thus, with steps 56 through 70 being carried out, the system response is measured continuously through the sampled data. These measurements are summarized at step 72 in FIG. 3, where a value of the voltage with the line test circuitry open is determined, and steps 74 and 80 where a voltage across the power lines with the resistor 36 and capacitors in short circuit between the power lines is determined. Steps 76 and 80 represents measurement of the ring parameters used in the subsequent computations.

The calculations made of the inductive and resistive components of the power line impedance in accordance with the present techniques may be based upon the following computational scheme. As will be appreciated by those skilled in the art, the inductive-capacitive (LC) resonant frequency established upon opening of switch 42, with little or no damping in the circuit may be expressed by the relationship:

$$2\pi f = \frac{1}{\sqrt{L \, Cload}} \qquad \text{Equation 1}$$

where f is the resonant frequency of the LC circuit, L is the value of the inductive component of the line impedance, and the parameter Cload is the value of the effective capacitance of the circuit which may include both known and parasitic capacitance values.

It will be noted, however, the resistor 36, particularly where a very low value of resistance is chosen, will provide significant damping to the resonant ring. Indeed, as will be appreciated by those skilled in the art, the value of the resistor 36 chosen strikes a balance between the desire to adequately sample a voltage droop caused by the drain represented by the resistor, while providing a significantly long (i.e., less damped) resonant ring to permit measurement of the ring period or frequency. Considering such damping, the relationship indicated in Equation 1 becomes described by the following relationship:

$$2\pi f = \sqrt{\frac{1}{2L\,Cload} - \left(\frac{2R + Rload}{4L}\right)^2} \quad \text{Equation 2}$$

where the value R represents the value of the resistive component of the line impedance, and the value Rload represents the rating of the resistor 36 discussed above.

Recognizing that R is small compared to the load resistance, that is R is much less than Rload, Equation 2 may be solved for the value of the line inductance L, and expressed in terms only of the values of Cload, Rload and the frequency f:

$$L = \frac{\frac{1}{Cload} + \sqrt{\frac{1}{Cload^2} - (2\pi f)^2 Rload^2}}{4(2\pi f)^2}. \quad \text{Equation 3}$$

Because the presence of parasitic capacitance tends to act as a parallel capacitance to the capacitors of the current system, that is capacitors 38 and 40, Cload may be re-written by Equation 4.

$$Cload = C + Cp \quad \text{Equation 4}$$

where Cp is parasitic capacitance 24 of the circuit, and C is the effective capacitance of capacitors 38 and 40 determined by whether that are connected in series, parallel, or individually. Substituting Equation 4 into Equation 3 provides:

$$L = \frac{\frac{1}{C + Cp} + \sqrt{\frac{1}{(C + Cp)^2} - (2\pi f)^2 Rload^2}}{2(2\pi f)^2}. \quad \text{Equation 5}$$

To complete the system of equations desired for calculating the inductive and resistive components of the line impedance, in accordance with the present techniques, the voltage sag or droop caused by closure of switch 42 and the presence of the drain or burden resistor 36 may be expressed in terms of the voltage sampled across the power lines with the line test circuitry open, indicated by the quantity Vo, and the voltage across the power lines with the circuitry closed, Vr, that is, with the resistor 36 in a series across the power lines as follows:

$$Vr = Vo \frac{Rload}{j377L + R + Rload} \quad \text{Equation 6}$$

where Vo and Vr are either the peak or RMS AC voltage values. It should be noted that the value 377 in Equation 4 (and in the subsequent equations below) is derived from the product of $2\pi$ and a line frequency of 60 Hz. As will be appreciated by those skilled in the art, the equations will differ for other line frequencies, although the principles for computation of the line impedance parameters will remain unchanged. Equation 6 may be rewritten as follows:

$$Vr = Vo \frac{Rload}{\sqrt{(377L)^2 + (R + Rload)^2}}. \quad \text{Equation 7}$$

It may be noted that Equation 5 may be solved in terms of the value of the resistive component of the line impedance, R, as follows:

$$R = \sqrt{\frac{(Vo\,Rload)^2 - (Vr377L)^2}{Vr^2}} - Rload. \quad \text{Equation 8}$$

Thus, based upon four measured values alone, the values of the parasitic capacitance of the system Cp, inductive component of the line impedance, L, and the resistive component of the power line impedance, R, may be computed by Equations 5 and 8. The measured values, in accordance with the present technique, are the values of Vo, Vr, and two frequency f measurements, or the period, which will be appreciated by those skilled in the art, is the inverse of this frequency value.

Further, as discussed above, when parasitic or other capacitances are present, the resonant frequency is altered and can no longer be used to directly calculate the line inductance via Equation 3 because Cload will be underestimated. In other words, if parasitic capacitance is not present, the frequency of the resonance will only shift by the difference in the load capacitance (i.e., capacitor 38 and 40). Therefore, the presence of a parasitic capacitance may be detected by comparing the shift in the resonant frequencies given two known load capacitances. Additionally, if the parasitic capacitance is not too large, when compared to the load capacitance, the parasitic capacitance may be determined by iteratively solving Equation 5. That is, two independent equations may be written given the two measured frequencies, two effective capacitances (C) and the known resistance (R). Further, parasitic capacitance (Cp) and the inductive component (L) may be determined by using these two independent equations to iteratively solve for L by substituting values of Cp until the calculated values for L converge.

In one embodiment of the present invention, a program is used to simultaneously solve these two equations. An exemplary embodiment of such a program is available from National Instruments located in Austin, Tex., and may be identified by the trade name LabVIEW. The program uses an algorithm that includes a while loop to enable the system to input the values for Rload, C, and the frequencies determined in the process described above. Next, a scaled version of the loop index is used and an estimate of Cp is added to the values of C in both independent equations. The two values of L are computed, using the estimated Cp, and then compared. The correct Cp and L is determined when either the difference in the two L values falls within an error range or when increasing Cp results in an increase in the error beyond a predetermined amount.

In one embodiment of the present invention, the error range is set at less than 5 percent. However, various error ranges may be used and embodiments of the present invention are not limited to this specific error range. Additionally, Cp may be initially set to a small negative number to ensure that the solution will indeed converge. Likewise, an iteration limit may be included that aborts the solution if it has not converged by a pre-determined maximum number of iterations. Once again, this iteration number can be various numbers and one of the contemplated embodiments sets this value at 19,000. Finally, although embodiments of the present invention include the LabVIEW program, the inventive technique is by no means limited to this program or even to software in general, and may enable any suitable iterative system or technique.

An example of an embodiment of the present invention discussed above was reduced to practice and used to determine the values of Cp and L for two electrical power systems. In the first scenario, the power system was configured so that there was not a significant parasitic capacitance connected in parallel with line impedance measurement system 10. For this scenario, the algorithm calculated a parasitic capacitance of 0.4 µF, where the non-zero calculated value may be attributable to tolerances of the capacitors within the measurement system. The initial Cp value was estimated at −10 µF and the error dropped below 5% within 105 iterations. Most importantly, this example illustrates that embodiments of the present invention can detect when a significant parasitic capacitance is not present because 0.4 µF would be considered a relatively insignificant parasitic capacitance for most applications.

In the second example, a significant parasitic capacitance was included in parallel with line impedance measurement system 10. In this scenario, the algorithm calculated a parasitic capacitance of 94.4° F. and did require more iteration in order to converge. Specifically, the 94.4 µF value was not reached until after 1,000 iterations. Additionally, larger values for Cp (e.g., 100 µF) only increased the error value thereby signally the equations had converged. Most importantly, this example illustrates that if the parasitic capacitance was not determined using the present inventive technique, the short circuit current would have been low by a factor of two. Therefore, this example illustrates that embodiments of the present invention can detect when a parasitic capacitance is present, and further shows one example of the degree of the error that may result when the parasitic capacitance is not properly determined. Moreover, this corrected estimate of the short circuit current is far more desirable than the uncorrected estimate when used for the purpose of determining personal protective equipment.

Figure 4:
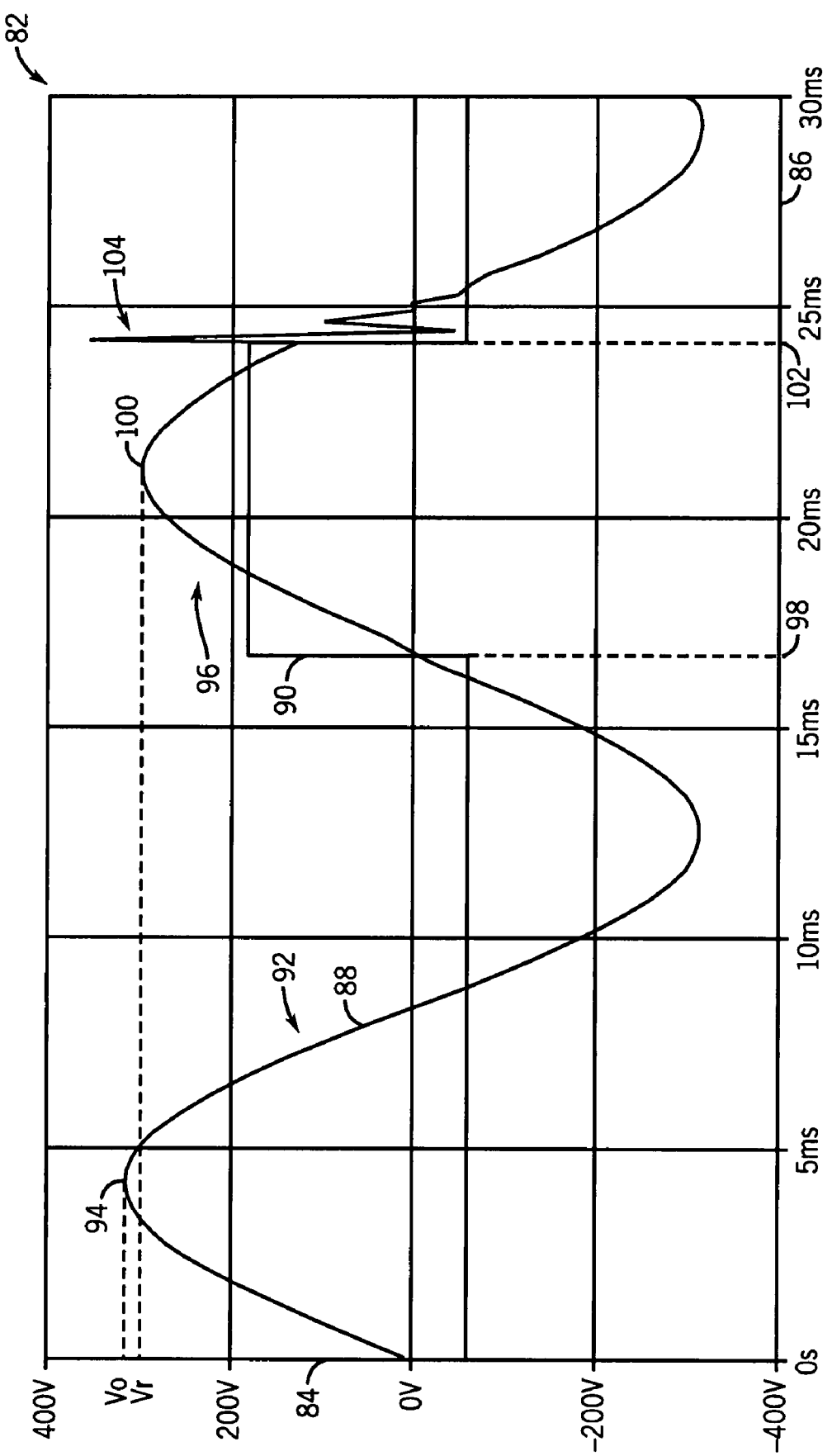
FIG. 4 is an exemplary voltage waveform and a resulting switching waveform generated by implementing the circuitry shown in FIGS. 2A-2C to cause a voltage droop and a resonant ring used to determine impedance parameters.

FIG. 4 illustrates an exemplary AC voltage waveform and a switching waveform for the switch 42 during an exemplary test sequence used to measure values for use in calculating the impedance parameters in accordance with Equations 5 and 8 discussed above. FIG. 4 illustrates the waveforms graphically as indicated generally by reference numeral 82. The voltage waveform or base AC waveform is illustrated graphically with respect to voltage, as indicated axis 84 over time, as indicated by axis 86. The voltage trace 88 of the waveform takes the form of a sine wave. Trace 90 represents the state of switch 42 or, more particularly, the signal applied to drive the gate of the switch to change its conductive state during the testing procedure.

As can be seen from FIG. 4, once sampling of the waveform has begun, samples will be taken continuously at a desired frequency, above the Nyquist rate, to provide reliable data for analysis. In a first cycle 92 of the waveform, with the test circuit open, a peak voltage 94, corresponding to Vo will be detected, among the other values detected and stored. At some point during or preceding a second cycle 96, switch 42 is placed in a conductive state to complete the current carrying path between the line conductors. The change in state of the switch is indicated at the rising edge 90 of the waveform, and occurs at time 98. As a result of the significant voltage drain caused by resistor 36, a sag or droop is detected in the peak 100 of the voltage waveform, with the peak generally corresponding to the value Vr. Subsequently, the switch 42 is opened, as indicated by the drop in waveform 90 that occurs at time 102 indicated in FIG. 4. The opening of switch 42 causes a resonant ring as indicated generally at reference numeral 104. As noted above, the resonant ring may have a peak voltage above the peak voltage of the sinusoidal waveform, and the switch 42 may be selected to accommodate such peaks.

Figure 5:
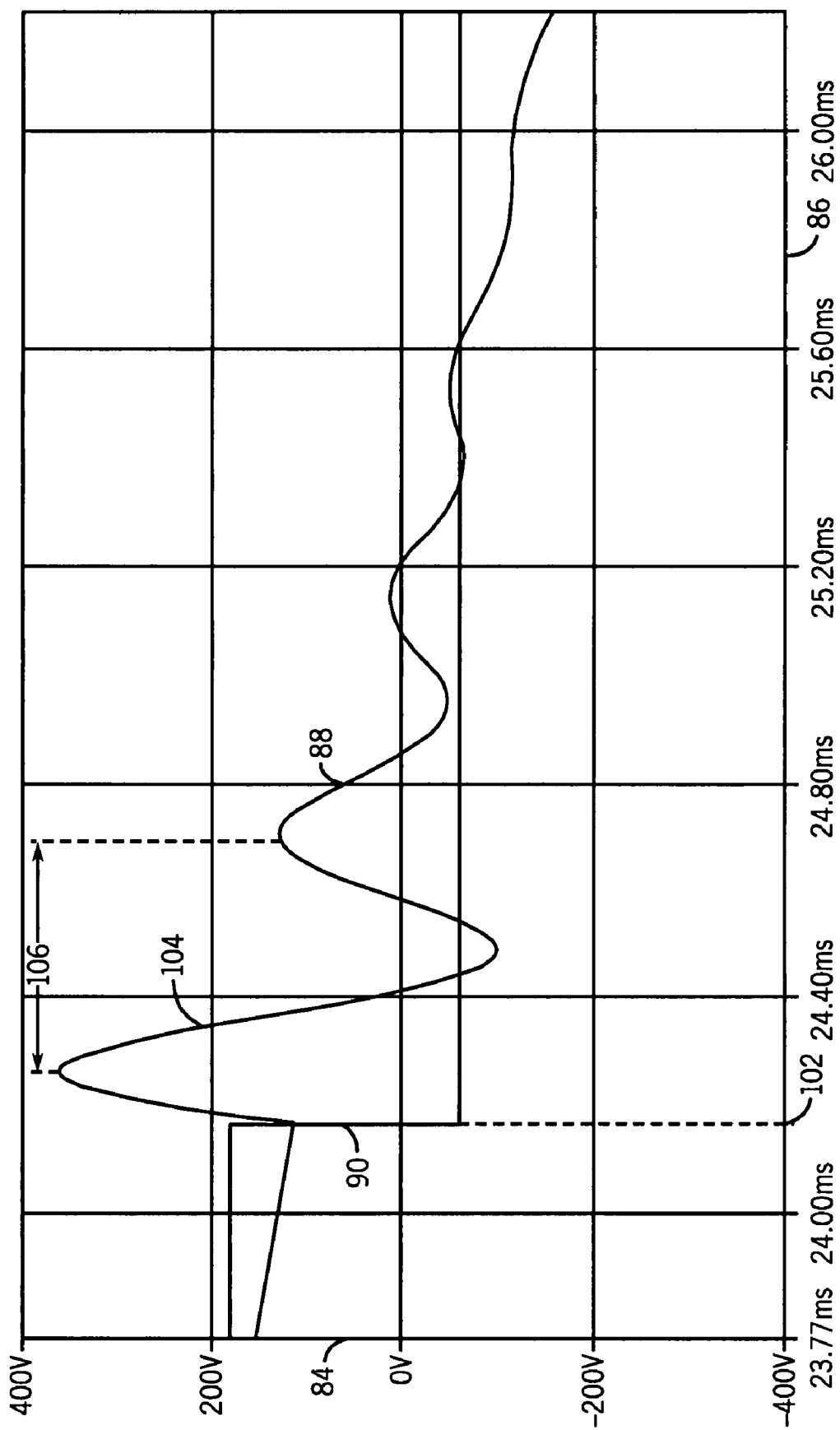
FIG. 5 is a detailed view of an exemplary resonant ring caused in a voltage waveform that may used to determine impedance parameters in accordance with aspects of the present technique.

FIG. 5 illustrates a more detailed view of the resonant ring occurring from opening of the switch of the line test circuitry. Again graphed with respect to a voltage axis 84 and a time axis 86, the ring occurs as the voltage across the lines is decreasing, as indicated by the initial slope of trace 88. The falling edge of waveform 90 represents the removal of the drive signal to the switch causing opening of the circuit. The resulting resonant ring 104 will have a period, or consequently a frequency, that is a function of the circuit component parameters, parasitic capacitance, and of the inductive component of the line impedance. Because the voltage waveform is continuously sampled, the frequency or period may be measured, with a full period being indicated by reference numeral 106 in FIG. 5. As will be apparent to those skilled in the art, the period may be measured in a number of ways, as may the frequency. For example, a half cycle alone may be used to determine the frequency or period, or a full or even more than one cycle may be used. Similarly, in a present embodiment, the values of the ring as sampled by the circuitry may be compared or processed with the naturally declining value of the sinusoidal waveform to provide an accurate indication of the period of the resonant ring.

Further, even though FIG. 5 only illustrates a single ring, the inventive technique generates two resonant rings via the use of two different effective capacitances as discussed with regards to FIGS. 2A-2C. Therefore, FIGS. 4 and 5 are representative of either of the first, second, or additional resonant rings. Additionally, even though the rings may not have the same exact values they will have typically the same general form and may be interrogated to determine the desired parameters (e.g., frequency 106). Thus, based upon the measured voltages, Vo, Vr, and either the period of the first and second resonant ring or their frequency, Equations 5 and 8 may be employed for determining the values of the parasitic capacitance of the system Cp, inductive component of the line impedance, L, and the resistive component of the power line impedance per the process discussed above.

Figure 6:
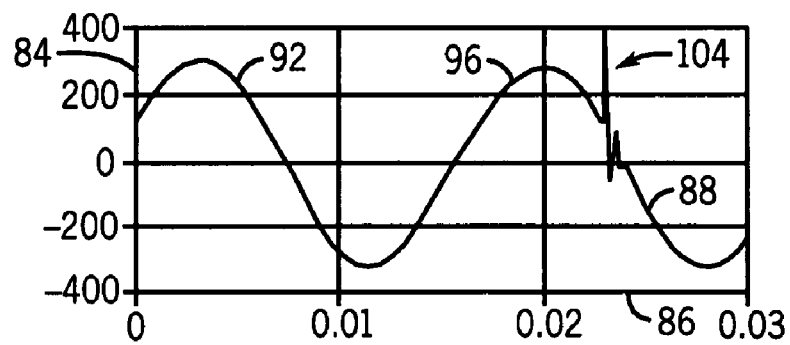
FIG. 6 is graphical representation of a voltage waveform similar to that of FIG. 4, before exemplary filtering of sampled data.
Figure 7:
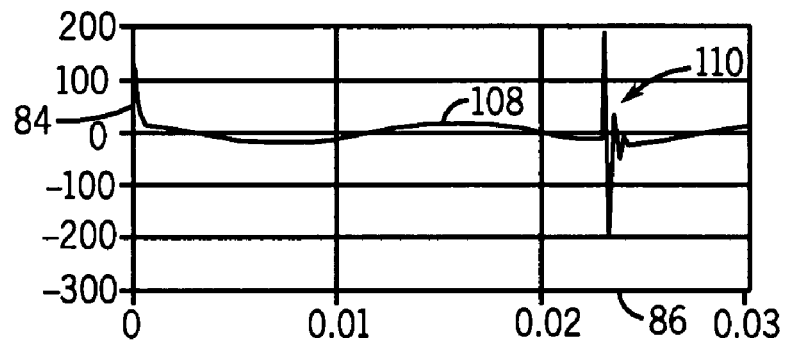
FIG. 7 is a graphical representation of the waveform of FIG. 6 following high pass filtering of sampled data to flatten a portion of the waveform around a resonant ring.
Figure 8:
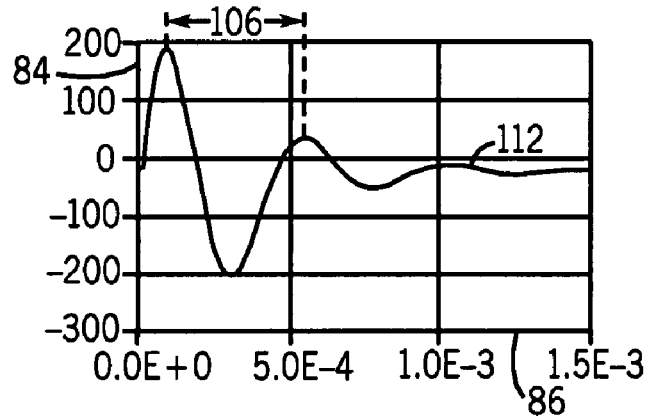
FIG. 8 is a more detailed illustration of the resonant ring visible in FIG. 7 from which measurements can be made for computing impedance parameters.

An alternative approach to identifying the parameters discussed above is illustrated in FIGS. 6-9. As illustrated in FIG. 6, the voltage waveform that is sampled by the voltage measurement circuitry may be illustrated as having successive cycles 92 and 96, with a voltage droop or sag occurring in cycle 96 due to the resistor 36 discussed above. The subsequent ring upon a removal of the short circuit across the power lines is again indicated at reference numeral 104. The data may be high-pass filtered to generally flatten the waveform as indicated at reference numeral 108 in FIG. 7. The high-pass filtered waveform will then exhibit the ring which may be timed to occur during a generally linear portion of the sine wave, as indicated at reference numeral 110 in FIG. 7. From the data, the ring 112 may be extracted as indicated generally in FIG. 8. The period, or half period, or frequency of the ring may then be determined, as indicated at reference numeral 106 in FIG. 8.

Figure 9:
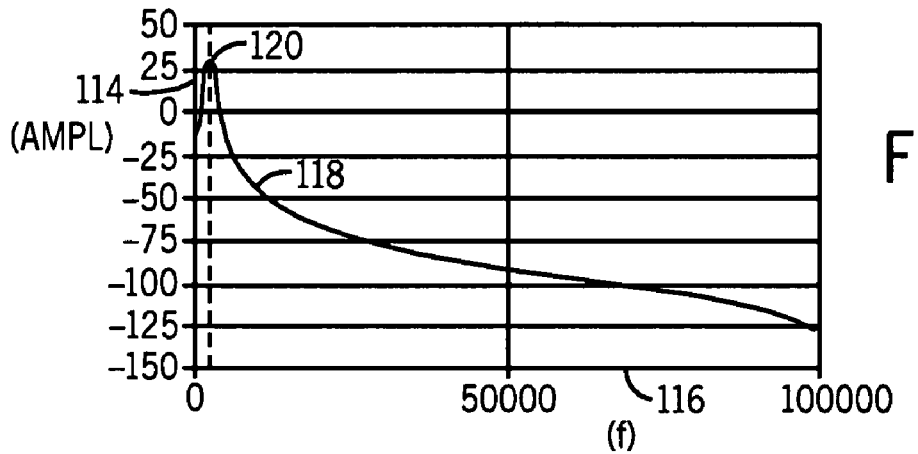
FIG. 9 is a graphical representation of an exemplary frequency domain plot of the ring illustrated in FIG. 8.

Finally, where desired, the waveform may be converted by a one-dimensional fast Fourier transform to a frequency response relationship as indicated in FIG. 9. This frequency response may be represented graphically along an amplitude axis 114 and a frequency axis 116. The frequency trace 118 in FIG. 9 indicates a resonant frequency at peak 120 which generally corresponds to the wavelength measured for the resonant ring as discussed above. As before, this method may be used to determine the resonant frequency for the first, second, or additional resonant rings even though it is only illustrates a single ring.

Once the parasitic capacitance, line inductance, and line resistance is determined the data may be further used with other system and modules to determine critical power line parameters, such as for motor control centers ("MCCs"), switchboards, switchgear, panelboards, pull boxes, junction boxes, cabinets, other electrical enclosures, and distribution components. These parameters may include the incident energy of a potential arc flash in an electrical device, a flash protection boundary, and a personal protective equipment ("PPE") level for a user. Systems that may calculate these parameters and methods for using such systems are disclosed in U.S. Patent Application 2006/0229831, U.S. Patent Application 2006/0229834, and U.S. Patent Application 2006/0241881, the disclosures of which are incorporated herein by reference and in accordance with the measurement method and system disclosed. Moreover, as discussed above, all of the disclosed techniques may be used on single-phase and three-phase applications with little modification. The techniques can also be implemented in permanent (i.e., hard-wired) circuitry, or can be part of portable or even hand-held devices used to determine the incident energy on a periodic or sporadic basis. Still further, the technique may be implemented in a stand-alone embodiment or in a distributed network.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for determining power line impedance, comprising:
    measuring a base voltage of an AC waveform applied to an electrical line;
    draining current from the line and measuring a first droop voltage of the AC waveform during a droop in voltage resulting from the current drain;
    removing the current drain to cause a first resonant ring in the voltage in the line;
    measuring a parameter of the first resonant ring;
    subsequently draining current from the line and measuring a second droop voltage of the AC waveform during a droop in voltage resulting from the subsequent current drain;
    removing the subsequent current drain to cause a second resonant ring in the voltage in the line, the second resonant ring being different from the first resonant ring;
    measuring a parameter of the second resonant ring; and
    computing the line impedance based upon the measured voltages and the measured parameters.

2. The method of claim 1, wherein draining current includes closing a solid state switch to place a resistor between the line and a different electrical potential.

3. The method of claim 1, comprising placing a first effective capacitance between the line and a different electrical potential, wherein the period or frequency of the first resonant ring is a function of the first effective capacitance and inductive and parasitic components of the line impedance, and placing a second effective capacitance between the line and the different electrical potential, wherein the period or frequency of the second resonant ring is a function of the second effective capacitance and the inductive and parasitic components of the line impedance.

4. The method of claim 3, comprising connecting a first capacitor and a second capacitor in series to produce the first effective capacitance.

5. The method of claim 3, comprising connecting a first capacitor and a second capacitor in parallel to produce the first effective capacitance.

6. The method of claim 1, comprising computing parasitic capacitance, resistive, and inductive components of the line impedance.

7. The method of claim 1, wherein the parameter of the first and second resonant ring is a period or a frequency of the ring.

8. A method for determining power line impedance, comprising:
    measuring a base voltage of an AC waveform applied to an electrical line;
    closing a solid state switch to place a resistor between the line and a different electrical potential;
    measuring a first droop voltage of the AC waveform during a droop in voltage resulting from current drain through the resistor;
    opening the solid state switch to cause a first resonant ring in the voltage in the line based on the line impedance;
    measuring a parameter of the first resonant ring;
    closing the solid state switch to place the resistor between the line and a different electrical potential;
    measuring a second droop voltage of the AC waveform during a droop in voltage resulting from current drain through the resistor;
    opening the solid state switch to cause a second resonant ring in the voltage in the line based on the line impedance;
    measuring a parameter of the second resonant ring; and
    computing capacitive, inductive, and resistive components in the line impedance based upon the measured voltages and the measured parameters.

9. The method of claim 8, wherein the first resonant ring has a frequency that is a function of the inductive and capacitive components of the line impedance and a first effective capacitance coupled to the resistor, and the second resonant ring has a frequency that is a function of the inductive and capacitive components of the line impedance and a second effective capacitance coupled to the resistor.

10. The method of claim 9, comprising connecting a first capacitor and a second capacitor in series to produce the first effective capacitance.

11. The method of claim 9, comprising connecting a first capacitor and a second capacitor in parallel to produce the first effective capacitance.

12. The method of claim 8, wherein the parameter of the first and second resonant rings is a frequency or a period.

13. The method of claim 8, wherein the inductive and capacitive components of the power line impedance are computed using a first effective capacitance value determined by the coupling of a first and second capacitor, a second effective capacitance value of the first capacitor, a resistance value of the resistor, and a frequency or a period of the first and second resonant rings.

14. The method of claim 13, wherein the capacitive and inductive components of the power line impedance are determined based upon the relationship:

$$L = \frac{\frac{1}{C+Cp} + \sqrt{\frac{1}{(C+Cp)^2} - (2\pi f)^2 Rload^2}}{2(2\pi f)^2}$$

where L is the inductive component of the power line impedance, C is the value for either the first or second effective capacitance, Rload is the resistance value of the resistor, f is the frequency of either the first or second resonant ring, and Cp is the capacitance component of the power line impedance.

15. A method for determining power line impedance, comprising:
- sampling power line voltage with and without a resistor in short circuit with the power line;
- causing a first resonant LC ring in the power line voltage and sampling power line voltage during the first resonant ring;
- identifying a parameter of the first resonant LC ring;
- causing a second resonant LC ring in the power line voltage and sampling power line voltage during the second resonant ring;
- identifying a parameter of the second resonant LC ring; and
- computing a component of the line impedance based upon the measured voltages and the parameter of the first and second resonant LC ring.

16. The method of claim 15, wherein the first resonant LC ring results from a first effective capacitance coupled to the resistor, and the second resonant LC ring results from a second effective capacitance coupled in series with the resistor.

17. The method of claim 15, wherein the parameter of the first and second resonant LC ring is a frequency or period.

18. A system for determining power line impedance, comprising:
- a resistor to be coupled between power line conductors;
- a first capacitance;
- a first switch for placing the resistor in a short circuit between the power line conductors and for interrupting the short circuit to cause a first resonant ring between the first capacitance and an inductive and a capacitive component of the power line impedance;
- a second capacitance;
- a second switch for placing a second capacitance in-circuit with the first capacitance and the resistor to cause a second resonant ring between the first and second capacitance and the inductive and capacitive components of the power line impedance;
- measurement circuitry for measuring voltages during a test sequence in which the first switch, second switch, or both are switched on and off; and
- processing circuitry for determining power line impedance based upon the measured voltages.

19. The system of claim 18, wherein the second capacitance is placed in series with the first capacitance when the second switch is engaged.

20. The system of claim 18, wherein the second capacitance is placed in parallel with the first capacitance when the second switch is engaged.

21. The system of claim 18, wherein the processing circuitry determines inductive and capacitive components of the power line impedance based upon a capacitance value of the first and second capacitances, a resistance value of the resistor, and a frequency or a period of the first and second resonant rings.

22. The system of claim 21, wherein the processing circuitry determines the inductive and capacitive components of the power line impedance based upon the relationship:

$$L = \frac{\frac{1}{C+Cp} + \sqrt{\frac{1}{(C+Cp)^2} - (2\pi f)^2 Rload^2}}{2(2\pi f)^2}$$

where L is the inductive component of the power line impedance, C is the value for the first or second effective capacitance, Rload is the resistance value of the resistor, f is the frequency of either the first or second resonant ring, and Cp is the capacitance component of the power line impedance.

23. A system for determining power line impedance, comprising:
- voltage measurement circuitry for measuring voltage values in the power line;
- test circuitry including a solid state switch in series with a burden resistor and in parallel with a first capacitor, the solid state switch being switchable to place the resistor in a short circuit between the power line and a different potential and to cause a first resonant ring between the first capacitor and an inductive and a capacitive component of the power line impedance, a second capacitance, and a second switch switchable to place a second capacitor in-circuit with the first capacitor to cause a second resonant ring between the first and second capacitors and the inductive and capacitive components of the power line impedance;
- drive circuitry for switching the solid state switch and second switch; and
- processing circuitry for determining capacitive, inductive, and resistive components of the power line impedance from voltage measurements made by the voltage measurement circuitry with and without the resistor in the short circuit and during the first and second resonant rings.

24. The system of claim 23, wherein the second capacitor is placed in series with the first capacitor when the second switch is switched.

25. The system of claim 23, wherein the second capacitor is placed in parallel with the first capacitor when the second switch is switched.

* * * * *